United States Patent
Basil et al.

(10) Patent No.: US 10,096,799 B2
(45) Date of Patent: Oct. 9, 2018

(54) ORGANIC LIGHT EMITTING DIODE WITH SURFACE MODIFICATION LAYER

(71) Applicant: Vitro S.A.B. de C.V., Cheswick, PA (US)

(72) Inventors: John D. Basil, Pittsburgh, PA (US); Abhinav Bhandari, Cranberry, PA (US); Harry Buhay, Allison Park, PA (US); Mehran Arbab, Pittsburgh, PA (US); Gary J. Marietti, Cheswick, PA (US)

(73) Assignee: Vitro, S.A.B. de C.V., Nuevo Leon (MX)

( * ) Notice: Subject to any disclaimer, the term of this patent is extended or adjusted under 35 U.S.C. 154(b) by 0 days.

(21) Appl. No.: 15/453,477

(22) Filed: Mar. 8, 2017

(65) Prior Publication Data

US 2017/0301886 A1    Oct. 19, 2017

Related U.S. Application Data

(62) Division of application No. 14/688,545, filed on Apr. 16, 2015, now Pat. No. 9,791,841.

(60) Provisional application No. 61/983,528, filed on Apr. 24, 2014.

(51) Int. Cl.
    *H01L 51/50*    (2006.01)
    *H01L 51/56*    (2006.01)
    *H01L 51/52*    (2006.01)

(52) U.S. Cl.
    CPC .......... *H01L 51/5268* (2013.01); *H01L 51/56* (2013.01)

(58) Field of Classification Search
    CPC . H01L 51/5268; H01L 51/0096; H01L 51/56; H01L 51/5275; H01L 51/5262; H01L 25/167; H01L 23/552; H01L 23/562; H01L 2224/16225
    See application file for complete search history.

(56) References Cited

U.S. PATENT DOCUMENTS

| | | | | |
|---|---|---|---|---|
| 2013/0334511 | A1* | 12/2013 | Savas | H01L 51/56 257/40 |
| 2014/0306213 | A1* | 10/2014 | Sato | H01L 51/5275 257/40 |
| 2015/0340656 | A1* | 11/2015 | So | H01L 51/5209 257/40 |
| 2016/0141528 | A1* | 5/2016 | Masuyama | G02B 5/1814 257/40 |

* cited by examiner

*Primary Examiner* — Caridad Everhart
(74) *Attorney, Agent, or Firm* — Andrew C. Siminerio (57) ABSTRACT

An organic light emitting diode includes a substrate having a surface modification layer. The surface modification layer includes a first film and a second film. The first film has a coefficient of expansion that is greater than the coefficient of expansion for the second film. The second film has ridges and troughs. A method of making a surface modification layer. A first film is formed over a substrate. The coated substrate is heated to expand the first film to a second surface area. A second film is formed over the expanded first film. The substrate coated with the first and second films is cooled to form ridges and troughs in the second film.

20 Claims, 3 Drawing Sheets

ORGANIC LIGHT EMITTING DIODE WITH SURFACE MODIFICATION LAYER

CROSS REFERENCE TO RELATED APPLICATION

This application is a divisional of U.S. patent application Ser. No. 14/688,545, filed Apr. 16, 2015, which claims priority to U.S. Provisional Application No. 61/983,528, filed Apr. 24, 2014, which are herein incorporated by reference in their entirety.

NOTICE OF GOVERNMENT SUPPORT

This invention was made with Government support under Contract No. DE-EE-0003209 awarded by the Department of Energy. The United States government may have certain rights in this invention.

BACKGROUND OF THE INVENTION

Field of the Invention

This invention relates generally to light emitting devices, such as organic light emitting diodes, and, more particularly, to a light emitting device having a light scattering surface and to methods of making the light emitting device.

Technical Considerations

An organic light emitting diode (OLED) is an example of a light-emitting device. An OLED has a multilayer structure incorporating an active stack having a thin organic film, e.g., an electroluminescent emissive layer of organic semiconductor material. The active stack is located between two electrodes (an anode and a cathode). When electric current is passed between the anode and the cathode, the emissive layer emits light, typically visible light in response to the application of an electric current. OLEDs are used in numerous applications, such as television screens, computer monitors, mobile phones, PDAs, watches, lighting, and various other electronic devices.

OLEDs provide numerous advantages over conventional inorganic light emitting devices, such as liquid crystals and incandescent or compact fluorescent lamps (CLFs). For example, an OLED functions without the need for a back light. In low ambient light, such as a dark room, an OLED screen can achieve a higher contrast ratio than conventional liquid crystal displays. OLEDs are also thinner, lighter, and more flexible than liquid crystal displays. OLEDs require less energy to operate and provide cost savings compared to incandescent or compact fluorescent lamps.

However, one disadvantage with OLEDs is that a significant amount of light generated by the active stack is lost due to the optical waveguide effect created by the refractive index differences between the various layers of the OLED. A portion of the light emitted by the emissive layer is reflected back at the various layer boundaries and becomes trapped within the layers. In a conventional OLED lighting device, about 80% of the visible light emitted from the organic emissive layer is trapped inside the OLED due to this optical waveguide effect.

Therefore, it would be advantageous to provide a device and/or method to extract more electromagnetic radiation, e.g., visible light, from an OLED than is possible in conventional OLEDs.

Currently, increased light extraction methods involve a combination of complex coating application methods and surface patterning methods. For example, the outer surface of the OLED substrate can be chemically etched (such as acid etched) or physically etched (such as by tools) to increase the surface roughness of the substrate surface. Increasing the surface roughness increases haze, which generally increases the amount of light extracted from the OLED. However, these current coating and patterning processes increase the manufacturing time and cost required to make the OLED and may lead to environmental concerns in storage and disposal of the etching and/or coating materials. Additionally, these methods do nothing to affect the waveguide effect between the various internal layers of the OLED.

Therefore, it also would be advantageous to provide a light emitting device, such as an OLED, and/or a method of making a light emitting device, having one or more of the following advantages over current devices or methods: reduced waveguide effect; higher light emission; simpler manufacturing process; reduced production cost; fewer production steps; and/or less complex production steps.

SUMMARY OF THE INVENTION

A summary of the invention is provided in the following numbered clauses.

Clause 1: An organic light emitting diode comprises a substrate having a first surface and a second surface; a first electrode; and a second electrode. An emissive layer is located between the first electrode and the second electrode. The organic light emitting diode further includes a surface modification layer comprising a non-planar surface.

Clause 2: The organic light emitting diode of clause 1, wherein the surface modification layer is located between the first electrode and the substrate.

Clause 3: The organic light emitting diode of clauses 1 or 2, wherein the surface modification layer provides at least one other layer of the organic light emitting diode with a non-planar surface, particularly a non-planar inner surface.

Clause 4: The organic light emitting diode of any of clauses 1 to 3, wherein the surface modification layer comprises a multilayer structure.

Clause 5: The organic light emitting diode of any of clauses 1 to 4, wherein the surface modification layer comprises a first film located over at least a portion of the substrate and a second film located over at least a portion of the first film. Preferably, the second film is in direct contact with the first film.

Clause 6: The organic light emitting diode of clause 5, wherein the first film has a first coefficient of expansion and the second film has a second coefficient of expansion. Preferably, the first coefficient of expansion is larger than the second coefficient of expansion.

Clause 7: The organic light emitting diode of clause 6, wherein the first coefficient of expansion (at 20° C., 10−6 m/mK) is at least 25, particularly at least 40.

Clause 8: The organic light emitting diode of clauses 6 or 7, wherein the first coefficient of expansion is not more than 220, particularly not more than 200. For example, not more than 80.

Clause 9: The organic light emitting diode of any of clauses 6 to 8, wherein the first coefficient of expansion (at 20° C., 10−6 m/mK) is in the range of 25 to 220, particularly in the range of 40 to 200.

Clause 10: The organic light emitting diode of any of clauses 6 to 9, wherein the second coefficient of expansion (at 20° C., 10−6 m/mK) is at least 1, particularly at least 4.

Clause 11: The organic light emitting diode of any of clauses 6 to 10, wherein the second coefficient of expansion is not more than 100, particularly not more than 80.

Clause 12: The organic light emitting diode of any of clauses 6 to 11, wherein the second coefficient of expansion (at 20° C., 10−6 m/mK) is in the range of 1 to 100, particularly 4 to 80.

Clause 13: The organic light emitting diode of any of clauses 6 to 12, wherein the first coefficient of expansion is greater than the second coefficient of expansion.

Clause 14: The organic light emitting diode of any of clauses 5 to 13, wherein the first film comprises a material selected from the group consisting of elastomeric materials, polymeric materials, polymeric organic materials, and mixtures thereof. For example, the first film can comprise a polyalkylsiloxane, particularly polydimethylsiloxane.

Clause 15: The organic light emitting diode of any of clauses 5 to 14, wherein the first film has a thickness of at least 1 nm, particularly at least 10 nm.

Clause 16: The organic light emitting diode of any of clauses 5 to 15, wherein the first film has a thickness of not more than 500 nm, such as not more than 100 nm.

Clause 17: The organic light emitting diode of any of clauses 5 to 16, wherein the first film has a thickness in the range of 1 nm to 500 nm, particularly 10 nm to 100 nm.

Clause 18: The organic light emitting diode of any of clauses 5 to 17, wherein the second film has a higher durometer than the first film.

Clause 19: The organic light emitting diode of any of clauses 5 to 18, wherein the second film comprises an oxide, metal oxide, nitride, and/or oxynitride film, particularly an oxide, nitride, and/or oxynitride of one or more of Zn, Fe, Mn, Al, Ce, Sn, Sb, Hf, Zr, Ni, Zn, Bi, Ti, Co, Cr, Si, and In. The second film can comprise an inorganic material.

Clause 20: The organic light emitting diode of any of clauses 5 to 19, wherein the second film has a thickness of at least 1 nm, particularly at least 4 nm.

Clause 21: The organic light emitting diode of any of clauses 5 to 20, wherein the second film has a thickness of not more than 300 nm, particularly not more than 50 nm.

Clause 22: The organic light emitting diode of any of clauses 5 to 21, wherein the second film has a thickness in the range of 1 nm to 300 nm, particularly 1 nm to 50 nm.

Clause 23: The organic light emitting diode of any of clauses 5 to 22, wherein the first film is formed by a wet deposition method, particularly a wet deposition method selected from the group consisting of spin coating, spray coating, flow coating, slot-die coating, and curtain coating.

Clause 24: The organic light emitting diode of any of clauses 5 to 23, wherein the second film is formed by MSVD.

Clause 25: The organic light emitting diode of any of clauses 5 to 24, wherein the second film is selected from the group consisting of alumina, silica, zinc oxide, zirconia, and combinations thereof, particularly a mixture of alumina and silica.

Clause 26: The organic light emitting diode of clause 1, wherein the surface modification layer comprises a single layer.

Clause 27: The organic light emitting diode of clause 26, wherein the surface modification layer comprises alumina or a mixture of alumina and silica.

Clause 28: The organic light emitting diode of clauses 26 or 27, wherein surface modification layer has a thickness of at least 1 nm, particularly at least 10 nm.

Clause 29. The organic light emitting diode of any one of clauses 26 to 28, wherein the surface modification layer has a thickness of not more than 500 nm, particularly not more than 100 nm. For example, the surface modification layer can have a thickness in the range of 1 nm to 500 nm, particularly 10 nm to 500 nm.

Clause 30: The organic light emitting diode of any of clauses 1 to 29, wherein the surface modification layer includes nanoparticles incorporated therein.

Clause 31: The organic light emitting diode of clause 30, wherein the nanoparticles comprise metal oxide nanoparticles, particularly nanoparticles selected from the group consisting of alumina, titania, cerium oxide, zinc oxide, tin oxide, silica, fumed silica, and zirconia.

Clause 32: The organic light emitting diode of clauses 30 or 31, wherein the nanoparticles are incorporated into the surface modification layer in the range of 0.1 weight percent to 50 weight percent, particularly 0.1 weight percent to 10 weight percent.

Clause 33: The organic light emitting diode of any of clauses 1 to 28, wherein the surface modification layer has a refractive index between the refractive index of the emissive layer and the refractive index of the substrate.

Clause 34: The organic light emitting diode of any of clauses 1 to 33, wherein the surface modification layer has an inner surface with an average surface roughness (Ra) in the range of 5 nm to 5000 nm, particularly 5 nm to 500 nm.

Clause 35: The organic light emitting diode of any of clauses 1 to 34, including at least one underlayer located between the surface modification layer and the substrate.

Clause 36: The organic light emitting diode of clause 35, wherein the underlayer comprises a single layer or a multilayer structure.

Clause 37: The organic light emitting diode of clauses 35 or 36, wherein the underlayer includes one or more metal oxide materials, particularly metal oxide materials selected from the group consisting of oxides of silicon, titanium, aluminum, zirconium, phosphorus, hafnium, niobium, zinc, bismuth, lead, indium, tin, and alloys and mixtures thereof.

Clause 38: The organic light emitting diode of any of clauses 35 to 37, wherein the underlayer is selected from the group consisting of a homogeneous layer, a gradient layer, and a plurality of layers.

Clause 39: The organic light emitting diode of any of clauses 35 to 38, wherein the underlayer comprises a mixture of at least silica and titania, particularly a mixture of silica, titania, and phosphorous oxide.

Clause 40: The organic light emitting diode of any of clauses 35 to 39, wherein the underlayer has a thickness in the range of 10 nm to 120 nm, particularly 30 nm to 70 nm.

Clause 41: The organic light emitting diode of any of clauses 1 to 40, wherein the first electrode is an anode.

Clause 42: The organic light emitting diode of any of clauses 1 to 41, wherein the second electrode is selected from the group consisting of barium, calcium, and magnesium.

Clause 43: The organic light emitting diode of any of clauses 1 to 42, wherein the second electrode is opaque.

Clause 44: The organic light emitting diode of any of clauses 1 to 42, wherein the second electrode is transparent.

Clause 45: The organic light emitting diode of any of clauses 1 to 44, wherein the first electrode comprises a multilayer structure.

Clause 46: The organic light emitting diode of any of clauses 1 to 45, wherein the first electrode is closer to the substrate than the second electrode.

Clause 47: The organic light emitting diode of any of clauses 1 to 46, wherein the surface modification layer comprises randomly oriented ridges.

Clause 48: A method of making an organic light emitting diode comprises: providing a surface modification layer over at least a portion of a substrate; and causing the surface modification layer to expand and/or contract to provide the surface modification layer with a non-planar surface.

Clause 49: The method of clause 48, including providing additional layers over the surface modification layer such that at least one of the additional layers comprises a non-planar surface, preferably a non-planar inner surface.

Clause 50: The method of clauses 48 or 49, wherein the causing step is accomplished by heating and/or cooling the surface modification layer.

Clause 51: The method of any of clauses 48 to 50, wherein surface modification layer comprises a first film over at least a portion of the substrate and a second film over at least a portion of the first film.

Clause 52: The method of any of clauses 48 to 51, wherein the method comprises: providing a first film of a surface modification layer over at least a portion of a substrate to form a coated substrate, wherein the first film has a first surface area; heating the coated substrate to an elevated temperature sufficient to cause the first film to expand to a second surface area; providing a second film of the surface modification layer over the first film while the surface area of the first film is greater than the first surface area; and cooling the coated substrate with the first film and the second film to cause at least one of the first film and the second film to contract such that a surface of the second film comprises a non-planar surface.

Clause 53: The method of clauses 51 or 52, wherein the first film has a first coefficient of expansion and the second film has a second coefficient of expansion.

Clause 54: The method of clause 53, wherein the first coefficient of expansion is greater than the second coefficient of expansion.

Clause 55: The method of any of clauses 51 to 54, wherein the first film comprises a material selected from the group consisting of elastomeric materials, polymeric materials, polymeric organic materials, and mixtures thereof. For example, a polyalkylsiloxane, particularly polydimethylsiloxane.

Clause 56: The method of any of clauses 51 to 55, wherein the first film has a thickness in the range of 1 nm to 500 nm, particularly as 1 nm to 300 nm.

Clause 57: The method of any of clauses 51 to 56, wherein the second film has a higher durometer than the first film.

Clause 58: The method of any of clauses 51 to 57, wherein the second film comprises an oxide, metal oxide, nitride, and/or oxynitride film, particularly an oxide, nitride, and/or oxynitride of one or more of Zn, Fe, Mn, Al, Ce, Sn, Sb, Hf, Zr, Ni, Zn, Bi, Ti, Co, Cr, Si, and In.

Clause 59: The method of any of clauses 51 to 58, wherein the second film has a thickness in the range of 1 nm to 300 nm, particularly 1 nm to 50 nm.

Clause 60: The method of any of clauses 51 to 59, wherein the first film is formed by a wet deposition method, particularly a wet deposition method selected from the group consisting of spin coating, spray coating, flow coating, slot-die coating, and curtain coating.

Clause 61: The method of any of clauses 51 to 60, wherein the second film is formed by MSVD.

Clause 62: The method of any of clauses 51 to 61, wherein the second film is selected from the group consisting of alumina, silica, zinc oxide, zirconia, and combinations thereof.

Clause 63: The method of any of clauses 51 to 62, wherein the surface modification layer has a thickness in the range of 10 nm to 1000 nm, particularly 10 nm to 500 nm.

Clause 64: The method of any of clauses 51 to 63, wherein the surface modification layer has a refractive index between the refractive index of the emissive layer and the refractive index of the substrate.

Clause 65: The method of any of clauses 51 to 64, wherein the first film is deposited by a method selected from the group consisting of spin coating and spray coating, particularly spin coating.

Clause 66: The method of any of clauses 51 to 65, wherein the substrate and the first film are heated to a temperature, or are exposed to an elevated temperature for a period of time, to cause the first film to expand prior to application of the second film.

Clause 67: The method of clause 66, wherein the elevated temperature is in the range of 100° F. to 1,500° F. (38° C. to 815° C.), particularly 300° F. to 500° F. (149° C. to 260° C.).

Clause 68: The method of clauses 66 or 67, wherein the period of time is in the range of 1 minute to 10 minutes, particularly 1 minute to 5 minutes.

Clause 69: The method of any of clauses 51 to 68, wherein the second film is formed on the first film while the first film is in an expanded state.

Clause 70: The method of any of clauses 51 to 69, wherein the second film is formed on the first film while the first film is at an elevated temperature.

Clause 71: The method of any of clauses 51 to 70, wherein the second film is applied by MSVD.

Clause 72: The method of any of clauses 48 to 71, including positioning at least one underlayer between the surface modification layer and the substrate.

Clause 73: The method of clause 72, wherein the underlayer includes one or more metal oxide materials, particularly oxides of silicon, titanium, aluminum, zirconium, phosphorus, hafnium, niobium, zinc, bismuth, lead, indium, tin, and alloys and mixtures thereof.

Clause 74: The method of clauses 53, wherein the first coefficient of expansion (at 20° C., 10−6 m/mK) is at least 25, particularly at least 40.

Clause 75: The method of clause 74, wherein the first coefficient of expansion (at 20° C., 10−6 m/mK) is not more than 220, particularly not more than 200.

Clause 76: The method of clauses 74 or 75, wherein the second coefficient of expansion (at 20° C., 10−6 m/mK) is at least 4, particularly at least 10.

Clause 77: The method of any of clauses 74 to 76, wherein the second coefficient of expansion (at 20° C., 10−6 m/mK) is not more than 100, particularly not more than 80.

Clause 78: The method of any of clauses 74 to 77, wherein the first coefficient of expansion is greater than the second coefficient of expansion.

Clause 79: The method of any of clauses 48 to 50, wherein the surface modification layer comprises a single layer, particularly a single layer comprising alumina or a mixture of alumina and silica.

Clause 80: The method of any of clauses 48 to 79, wherein the surface modification layer has a thickness in the range of 1 nm to 1500 nm, particularly 1 nm to 1000 nm.

Clause 81: The use of a surface modification layer as set forth in any of clauses 1 to 81 in a light emitting device or a solar cell.

Clause 82: The use of an organic light emitting diode having a surface modification layer according to any of clauses 1 to 81 in an electronic device, particularly an electronic device selected from the group consisting of a computer monitor, a computer screen, a mobile phone, a television screen, a personal digital assistant, a watch, and a lighting device.

Clause 83: An organic light emitting diode, comprising: a substrate; and a surface modification layer located over the substrate modification comprising, a first film over at least a portion of the substrate having a first coefficient of expansion; and a second film over at least a portion of the first film having a second coefficient of expansion and comprising ridges and troughs wherein the first coefficient of expansion is greater than the second coefficient of expansion.

Clause 84: The organic light emitting diode of clause 93, wherein the second film is in direct contact with the first film.

Clause 85: The organic light emitting diode of any of the clauses 83 to 84, wherein the first film comprises a metal oxide.

Clause 86: The organic light emitting diode of clause 85, wherein the metal oxide is selected from the group consisting of alumina, titania, cerium oxide, zinc oxide, tin oxide, silica, fumed silica and zirconia.

Clause 87: The organic light emitting diode of any of the clauses 83 to 86, wherein the second film comprises an oxide, a metal oxide, a nitride or an oxynitride film having a metal selected from the group consisting having Zn, Fe, Mn, Al, Ce, Sn, Sb, Gf, Zr, Ni, Zn, Bi, Ti, Co, Cr, Si and In.

Clause 88: The organic light emitting diode of any of the clauses 83 to 87, wherein the second film is thinner than the first film.

Clause 89: The organic light emitting diode of any of the clauses 83 to 88, wherein the second film comprises an oxide selected from the group consisting of alumina, silica, zinc oxide, zirconia and combinations thereof.

Clause 90: The organic light emitting diode of any of the clauses 83 to 89, wherein the second film comprises alumina and silica.

Clause 91: The organic light emitting diode of any of the clauses 83 to 90, the first film comprises a nanoparticle selected from the group consisting of alumina, titania, cerium oxide, zinc oxide, tin oxide, silica, fumed silica and zirconia.

Clause 92: The organic light emitting diode of any of the clauses 83 to 91, wherein the first film comprises polyalkylsiloxane.

Clause 93: A method of making a surface modification layer comprising the steps of forming a first film having a first coefficient of expansion over at least a portion of a substrate; heating the substrate coated with the first film to an elevated temperature sufficient to cause the first film to expand to a second surface area; forming a second film over the first film having a second coefficient of expansion while the first film is expanded to have the second surface area; cooling the substrate coated with the first film and the second film thereby forming ridges and troughs in the second film, wherein the first coefficient of expansion is greater than the second coefficient of expansion.

Clause 94: The method of clause 93, wherein the second film comprises a metal oxide.

Clause 95: The method of clause 94, wherein the metal oxide is selected from the group consisting of alumina, silica, zinc oxide, zirconia, and combinations thereof.

Clause 96: The method of clause 94 or 95, wherein the metal oxide is a mixture of alumina and silica.

Clause 97: The method of any of the clauses 93 to 96, wherein the first film comprises a nanoparticle.

Clause 98: The method of clause 97, wherein the nanoparticle is selected from the group consisting of alumina, titania, cerium oxide, zinc oxide, tin oxide, silica, fumed silica and zirconia.

Clause 99: The method of clause 97 or 98, wherein the first film comprises 0.01 weight percent to 5 weight percent of the nanoparticle.

Clause 100: The method of any of the clauses 93 to 99, wherein the first coefficient of expansion is at least 100.

Clause 101: The method of any of the clauses 93 to 100, wherein the second coefficient of expansion is not more than 100.

Clause 102: The method of any of the clauses 93 to 101, wherein the first film comprises a polyalkylsiloxane.

DESCRIPTION OF THE PREFERRED EMBODIMENTS

Spatial or directional terms used herein, such as "left", "right", "upper", "lower", and the like, relate to the invention as it is shown in the drawing figures. It is to be understood that the invention can assume various alternative orientations and, accordingly, such terms are not to be considered as limiting.

All numbers used in the specification and claims are to be understood as being modified in all instances by the term "about". All ranges disclosed herein are to be understood to encompass the beginning and ending range values and any and all subranges subsumed therein. The ranges set forth herein represent the average values over the specified range.

The term "over" means "farther from the substrate". For example, a second layer located "over" a first layer means that the second layer is located farther from the substrate than the first layer. The second layer can be in direct contact with the first layer or one or more other layers can be located between the second layer and the first layer.

The terms "polymer" or "polymeric" include oligomers, homopolymers, copolymers, and terpolymers.

All documents referred to herein are to be considered to be "incorporated by reference" in their entirety.

Any reference to amounts, unless otherwise specified, is "by weight percent".

The term "film" means a region having a desired or selected composition. A "layer" comprises one or more "films". A "coating" is comprised of one or more "layers". The term "organic material" includes polymers as well as small molecule organic materials that can be used to fabricate organic opto-electronic devices.

The term "visible light" means electromagnetic radiation having a wavelength in the range of 380 nm to 780 nm. The term "infrared radiation" means electromagnetic radiation having a wavelength in the range of greater than 780 nm to 100,000 nm. The term "ultraviolet radiation" means electromagnetic energy having a wavelength in the range of 100 nm to less than 380 nm.

The terms "metal" and "metal oxide" include silicon and silica, respectively, as well as traditionally recognized metals and metal oxides, even though silicon may not be conventionally considered a metal. The term "curable" means a composition capable of polymerizing or crosslinking. By "cured" is meant that the material is at least partly polymerized or cross-linked, preferably fully polymerized or cross-linked. By "at least" is meant "greater than or equal to". By "not more than" is meant "less than or equal to".

Unless indicated to the contrary, all coefficients of expansion recited herein are for the material at 20° C., $10^{-6}$ m/mK.

All haze and transmittance values herein are those determined using a Haze-Gard Plus hazemeter (commercially available from BYK-Gardner USA) and in accordance with ASTM D1003-07.

The discussion of the invention herein may describe certain features as being "particularly" or "preferably" within certain limitations (e.g., "preferably", "more preferably", or "even more preferably", within certain limitations). It is to be understood that the invention is not limited to these particular or preferred limitations but encompasses the entire scope of the disclosure.

The invention comprises, consists of, or consists essentially of, the following aspects of the invention, in any combination. Various aspects of the invention are illustrated in separate drawing figures. However, it is to be understood that this is simply for ease of illustration and discussion. In the practice of the invention, one or more aspects of the invention shown in one drawing figure can be combined with one or more aspects of the invention shown in one or more of the other drawing figures.

For purposes of the following discussion, the invention will be described with reference to an OLED. However, it is to be understood that the invention is not restricted to use with OLEDs or other light emitting devices but could be practiced in other fields, such as, but not limited to, solar cells, for example, photovoltaic thin film solar cells.

Figure 1:
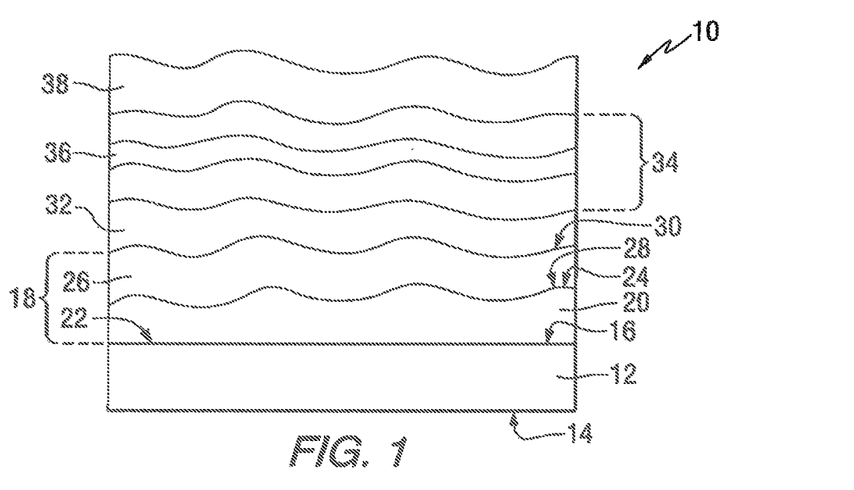
FIG. 1 is a side, sectional view (not to scale) of a light emitting device in the form of an OLED incorporating features of the invention.

An OLED 10 incorporating features of the invention is shown in FIG. 1. The OLED 10 includes a substrate 12 having a first surface (outer surface) 14 and a second surface (inner surface) 16. By "outer surface" is meant a surface facing the exterior of the OLED 10. By "inner surface" is meant a surface facing the interior of the OLED 10.

The OLED 10 further includes a surface modification layer 18. The surface modification layer 18 can be a single layer or can be a multi-layer. In FIG. 1, the illustrated exemplary surface modification layer 18 includes a first film 20 having a first surface (outer surface) 22 and a second surface (inner surface) 24 and a second film 26 having a first surface (outer surface) 28 and a second surface (inner surface) 30.

The OLED 10 further includes an electrically conductive first electrode 32 located over the surface modification layer 18, an active stack 34 incorporating an electroluminescent emissive layer 36 of organic material, and an electrically conductive second electrode 38. The general structure and operation of a conventional OLED (without the surface modification layer 18 of the invention) will be well understood by one of ordinary skill in the art and, therefore, will not be described in detail.

The surface modification layer 18 provides a non-planar surface (inner surface 30) onto which the other layers of the OLED 10 (for example, first electrode 32, active stack 34, and/or second electrode 38) can be formed. By "non-planar surface" is meant a surface having a buckled or wrinkled structure. For example, the non-planar surface can be or can include regions with alternating ridges and troughs. The distance between the ridges can be uniform or non-uniform across the non-planar surface. The depth of the troughs can be uniform or non-uniform across the non-planar surface. The ridges can be randomly oriented. By forming the other OLED layers on the non-planar surface 30 of the surface modification layer 18, at least one of these other layers, preferably more than one of these other layers, also exhibit one or more non-planar surfaces. The non-planar surfaces of the layer(s) decrease the optical waveguide effect and permit more light to be emitted from the OLED 10.

The substrate 12 is preferably a transparent substrate. By "transparent" is meant having haze of less than 25%, such as less than 20%, such as less than 15%, such as less than 10%, such as less than 5%. Preferably, the haze is less than 25%. More preferably, the haze is less than 15%. Even more preferably, the haze is less than 10%.

Examples of suitable materials for the substrate 12 include glass, such as conventional soda-lime silicate glass and float glass, and polymeric materials. The substrate 12 preferably has a high visible light transmittance at a reference wavelength of 550 nanometers (nm) and a reference thickness of 3.2 mm. By "high visible light transmittance" is meant visible light transmittance at 550 nm of at least 85%, such as at least 87%, such as at least 90%, such as at least 91%, such as at least 92%, such as at least 93%, such as at least 95%, at a 3.2 mm reference thickness. Preferably, the substrate 12 has a visible light transmittance at 550 nm and a 3.2 mm reference thickness of at least 85%. More preferably, the substrate 12 has a visible light transmittance at 550 nm and a 3.2 mm reference thickness of at least 90%. Even more preferably, the substrate 12 has a visible light transmittance at 550 nm and a 3.2 mm reference thickness of at least 93%. For example, the visible light transmittance can be in the range of 85% to 100%, such as 87% to 100%, such as 90% to 100%, such as 91% to 100%, such as 92% to 100%, such as 93% to 100%, such as 94% to 100%, such as 95% to 100%, such as 96% to 100% at a 3.2 mm reference thickness and for a wavelength of 550 nm. Non-limiting examples of glass that can be used for the practice of the invention include Starphire®, Solarphire®, Solarphire® PV, and CLEAR™ glass, all commercially available from PPG Industries, Inc. of Pittsburgh, Pa. Alternatively, the substrate 12 can be a polymeric substrate, such as an acrylic substrate.

The substrate 12 can have any desired thickness. For example, the substrate 12 can have a thickness of at least 0.5 mm. For example, a thickness of at least 1 mm. For example, a thickness of at least 1.5 mm. For example, a thickness of at least 2 mm, such as at least 2.5 mm, such as at least 3 mm, such as at least 3.5 mm, such as at least 4 mm, such as at least 5 mm, such as at least 6 mm, such as at least 7 mm, such as at least 8 mm, such as at least 9 mm, such as at least 10 mm.

For example, the substrate 12 can have a thickness of not more than 10 mm. For example, a thickness of not more than 9 mm, such as not more than 8 mm, such as not more than 7 mm, such as not more than 6 mm, such as not more than 5 mm, such as not more than 4 mm, such as not more than 3.5 mm. For example, the substrate 12 can have a thickness of not more than 5 mm.

For example, the substrate 12 can have a thickness in the range of 0.5 mm to 10 mm. For example, in the range of 1 mm to 10 mm. For example, in the range of 1.5 mm to 5 mm.

Both of the first and second electrodes 32, 38 can be transparent or one electrode can be transparent and the other electrode can be opaque (for example, reflective). For purposes of discussion of the invention, the OLED 10 illustrated in the figures will be described as a "bottom-emitting" OLED having a transparent first (bottom) electrode 32 and a reflective second (top) electrode 38. The first electrode 32 will be designated as the anode and the second electrode 38 will be designated as the cathode. However, it is to be understood that this is just for purposes of describing the invention and the invention is not limited to bottom-emitting OLEDs or to the first electrode 32 being the anode.

The first electrode (e.g., anode) 32 can be a single conductive layer or a multilayer structure incorporating a conductive layer. The first electrode 32 can be a conductive, transparent layer, such as a conductive metal or metal oxide layer, or can be a multilayer structure incorporating a conductive metal or metal oxide layer.

For example, the first electrode 32 can comprise one or more conductive oxide materials, such as, but not limited to, one or more oxides of one or more of zinc (Zn), iron (Fe), manganese (Mn), aluminum (Al), cesium (Ce), tin (Sn), antimony (Sb), hafnium (Hf), zirconium (Zr), nickel (Ni), zinc (Zn), bismuth (Bi), titanium (Ti), cobalt (Co), chromium (Cr), silicon (Si), indium (In), or an alloy of two or more of these materials, such as zinc stannate. The conductive material can also include one or more dopant materials, such as, but not limited to, fluorine (F), In, Al, phosphorous (P), Zn, and/or Sb. Specific examples of suitable materials include indium tin oxide (ITO), aluminum-doped zinc oxide (AZO), fluorine doped tin oxide, zinc doped indium oxide, tin doped indium oxide, vanadium doped indium oxide, and zinc and tin oxide (such as zinc stannate or a mixture of zinc oxide and tin oxide). For example, the conductive oxide can comprise tin oxide, particularly fluorine doped tin oxide.

For example, the first electrode 32 can be or can include a conductive metal layer. Examples of the conductive metal layer include metallic platinum, iridium, osmium, palladium, aluminum, gold, copper, silver, or mixtures, alloys, or combinations thereof. For example, the first electrode 32 can include a conductive metal layer located between two metal oxide layers.

The second electrode (cathode) 38 can be any conventional OLED cathode. Examples of suitable cathodes include metals, such as, but not limited to, barium, calcium, and magnesium. The second electrode 38 typically has a low work function. For OLEDs in which the light emission is only out of the bottom of the device through the substrate 12, the second electrode 38 can be a relatively thick and/or reflective metal layer having high electrical conductivity. The second electrode 38 can be opaque. By "opaque" is meant having a transmittance at a reference wavelength of 550 nm of less than 5%, for example less than 1%, for example 0%. For example, the second electrode 38 can be reflective of at least a portion of the light generated by the active stack 34. Alternatively, if it is desired for light to be emitted out of the top of the OLED 10, the second electrode 38 can be of a transparent material, such as those described above for the first electrode 32.

The active stack 34 can include any conventional emissive layer 36 known in the art. Examples of materials suitable for the emissive layer 36 include, but are not limited to, small molecules such as organometallic chelates (e.g., Alq$_3$), fluorescent and phosphorescent dyes, and conjugated dendrimers. Further examples of suitable materials include triphenylamine, perylene, rubrene, and quinacridone. Alternatively, electroluminescent polymeric materials can be used. Examples of conductive polymers include poly(p-phenylene vinylene) and polyfluorene. Phosphorescent materials could also be used. Examples of such materials include polymers such as poly(n-vinylcarbazole) in which an organometallic complex, such as an iridium complex, is added as a dopant.

The OLED 10 includes a surface modification layer 18. In FIG. 1, the surface modification layer 18 is depicted as a multilayer structure having the first film 20 located over, e.g., in direct contact with, the second surface 16 of the substrate 12 and the second film 26 located over, e.g., in direct contact with, the second surface 24 of the first film 20. The first film 20 has a first coefficient of expansion (e.g., a first coefficient of thermal expansion) and the second film 26 has a second coefficient of expansion (e.g., a second coefficient of thermal expansion). By "coefficient of expansion" is meant the fractional change in length or area or volume of a material per unit change in temperature (e.g., per degree) at a constant pressure. The first and second coefficients of expansion could be the same or similar. Preferably, the first coefficient of expansion is greater than the second coefficient of expansion.

The first film 20 comprises a material capable of expanding (e.g., increasing in surface area) when subjected to an increase in temperature (or other factor such as liquid absorption) and then contracting (e.g., returning to or substantially to its original dimensions, such as original surface area) upon cooling. Examples of suitable materials include elastomeric materials, polymeric materials, polymeric organic materials, and mixtures thereof; thermosetting materials, thermoplastic materials, and mixtures thereof. Specific examples include thermoplastic elastomers, such as styrenic block copolymers, polyolefin blends, elastomeric alloys, thermoplastic polyurethanes, thermoplastic copolyesters, and thermoplastic polyamides. Other suitable materials include polyurethanes, polypropylenes, polycarbonates, acrylics, polysiloxanes, silicon-containing coating materials, such as organosilicon-containing coating materials; silanes, siloxanes, and/or hydrolysates thereof; organosilanes; silyl substituted materials; and polymers derived from any such preceding such materials, such as polysilanes, polyorganosilanes, polyorganosiloxanes, polyorganosilazanes, and polyorganosilazoxanes. Specific examples include polymethylmethacrylate, polybenzimidazole, polyethylene, polypropylene, polystyrene, polyvinylchloride, polytetrafluoroethylene, polyalkylsiloxanes (such as polydimethylsiloxane), and tris[3(trimethoxysilyl)propyl]isocyanate. For example, the first film 20 can comprise a polymeric material. For example, the first film 20 can comprise a polyalkylsiloxane. For example, the first film 20 can comprise polydimethylsiloxane. An example of suitable materials for the first film 20 is the Hi-Card® family of coatings commercially available from PPG Industries, Inc.

The first film 20 can have any desired thickness to provide the desired non-planar surface described below. The thickness of the first film 20 can impact upon the amount of light absorbed, reflected, or transmitted by the first film 20. Generally, the thinner the first film 20, the less impact it will have on the light emission of the OLED 10.

For example, the first film 20 can have a thickness of at least 1 nm, such as at least 5 nm, such as at least 15 nm, such as at least 20 nm, such as at least 25 nm, such as at least 30 nm, such as at least 40 nm, such as at least 50 nm, such as at least 75 nm, such as at least 100 nm, such as at least 200 nm, such as at least 300 nm, such as at least 400 nm, such as at least 500 nm. For example, the first film 20 can have a thickness of at least 1 nm. For example, the first film 20 can have a thickness of at least 15 nm. For example, the first film 20 can have a thickness of at least 25 nm.

For example, the first film 20 can have a thickness of not more than 500 nm, such as not more than 400 nm, such as not more than 300 nm, such as not more than 200 nm, such as not more than 100 nm, such as not more than 75 nm, such as not more than 50 nm, such as not more than 40 nm, such as not more than 30 nm, such as not more than 25 nm, such as not more than 20 nm, such as not more than 15 nm, such as not more than 10 nm, such as not more than 5 nm. For example, the first film 20 can have a thickness of not more than 500 nm. For example, the first film 20 can have a thickness of not more than 300 nm. For example, the first film 20 can have a thickness of not more than 100 nm.

For example, the first film 20 can have a thickness in the range of 1 nm to 500 nm. For example, the thickness can be in the range of 10 nm to 100 nm.

For example, the first film 20 can have a coefficient of expansion (at 20° C., $10^{-6}$ m/mK) of at least 25, such as at least 30, such as at least 40, such as at least 50, such as at least 60, such as at least 80, such as at least 100, such as at least 120, such as at least 140, such as at least 150, such as at least 160, such as at least 180, such as at least 200, such as at least 220. For example, the first film 20 can have a coefficient of expansion of at least 25. For example, the first film 20 can have a coefficient of expansion of at least 30. For example, the first film 20 can have a coefficient of expansion of at least 50.

For example, the first film 20 can have a coefficient of expansion (at 20° C., $10^{-6}$ m/mK) of not more than 220, such as not more than 200, such as not more than 180, such as not more than 160, such as not more than 150, such as not more than 140, such as not more than 120, such as not more than 100, such as not more than 80, such as not more than 60, such as not more than 50, such as not more than 40. For example, the first film 20 can have a coefficient of expansion of not more than 220. For example, the first film 20 can have a coefficient of expansion of not more than 180. For example, the first film 20 can have a coefficient of expansion of not more than 100.

For example, the first film 20 can have a coefficient of expansion (at 20° C., $10^{-6}$ m/mK) in the range of 25 to 220. For example, in the range of 40 to 200.

The second film 26 can be a harder film than the first film 20. That is, the second film 26 can have a higher durometer than the first film 20.

For example, the second film 26 can be an oxide, metal oxide, nitride, or oxynitride film. For example, the second film 26 can include an oxide, nitride, or oxynitride of one or more of Zn, Fe, Mn, Al, Ce, Sn, Sb, Hf, Zr, Ni, Zn, Bi, Ti, Co, Cr, Si, In, and combinations thereof. Specific examples include alumina, silica, zinc oxide, zirconia, and combinations thereof. For example, the second film 26 can comprise an inorganic material. For example, the second film 26 can comprise alumina and/or silica.

For example, the second film 26 can comprise a mixture of alumina and silica. For example, the second film 26 can comprise a mixture of alumina and silica having at least 10 wt. % alumina, such as at least 15 wt. % alumina, such as at least 20 wt. % alumina, such as at least 40 wt. % alumina, such as at least 50 wt. % alumina, such as at least 60 wt. % alumina, such as at least 70 wt. % alumina, such as at least 80 wt. % alumina. For example, the second film 26 can comprise 50 wt. % to 70 wt. % alumina and 50 wt. % to 30 wt. % silica. For example, the second film 26 can comprise 55 wt. % to 65 wt. % alumina and 45 wt. % to 35 wt. % silica. For example, the second film 26 can comprise 60 wt. % alumina and 40 wt. % silica.

The second film 26 can have any desired thickness. For example, the second film 26 can have a thickness of at least 1 nm, such as at least 5 nm, such as at least 10 nm, such as at least 15 nm, such as at least 20 nm, such as at least 25 nm, such as at least 30 nm, such as at least 40 nm, such as at least 50 nm, such as at least 75 nm, such as at least 100 nm, such as at least 200 nm, such as at least 300 nm, such as at least 400 nm, such as at least 500 nm. For example, the second film 26 can have a thickness of at least 1 nm. For example, the second film 26 can have a thickness of at least 5 nm. For example, the second film 26 can have a thickness of at least 25 nm.

For example, the second film 26 can have a thickness of not more than 500 nm, such as not more than 400 nm, such as not more than 300 nm, such as not more than 200 nm, such as not more than 100 nm, such as not more than 75 nm, such as not more than 50 nm, such as not more than 40 nm, such as not more than 30 nm, such as not more than 25 nm, such as not more than 20 nm, such as not more than 15 nm, such as not more than 10 nm, such as not more than 5 nm. For example, the second film 26 can have a thickness of not more than 500 nm. For example, the second film 26 can have a thickness of not more than 100 nm. For example, the second film 26 can have a thickness of not more than 80 nm. The thickness of the second film 26 can impact upon the amount of light absorbed, reflected, or transmitted by the second film 26. Generally, the thinner the second film 26, the less impact it will have on the light emission of the OLED 10. The second film 26 can be thinner than the first film 20.

For example, the second film 26 can have a thickness in the range of 1 nm to 300 nm. For example, in the range of 1 nm to 50 nm.

The second film 26 can have a coefficient of expansion (at 20° C., $10^{-6}$ m/mK) of at least 4. For example, at least 6, such as at least 7, such as at least 10, such as at least 15, such as at least 20, such as at least 40, such as at least 60, such as at least 80, such as at least 100. For example, the second film 26 can have a coefficient of expansion of at least 4. For example, the second film 26 can have a coefficient of expansion of at least 10. For example, the second film 26 can have a coefficient of expansion of at least 20.

For example, the second film 26 can have a coefficient of expansion (at 20° C., $10^{-6}$ m/mK) of not more than 100, such as not more than 80, such as not more than 60, such as not more than 40, such as not more than 20, such as not more than 15, such as not more than 10, such as not more than 8, such as not more than 6. For example, the second film 26 can have a coefficient of expansion of not more than 100. For example, the second film 26 can have a coefficient of expansion of not more than 80. For example, the second film 26 can have a coefficient of expansion of not more than 40.

For example, the second film 26 can have a coefficient of expansion (at 20° C., $10^{-6}$ m/mK) in the range of 1 to 100. For example, in the range of 4 to 80.

The layers of the OLED 10 can be formed by any conventional methods. Examples include spray pyrolysis, chemical vapor deposition (CVD), magnetron sputter vacuum deposition (MSVD), spin coating, flow coating, slot-die coating, and curtain coating. The layers can be formed by the same method or different layers can be formed by different methods. For example, the first film 20 can be formed on the substrate 12 by a wet deposition method, such as spin coating, spray coating, flow coating, slot-die coating, or curtain coating. The second film 26 can be formed by another method, for example by MSVD.

A method of practicing the invention with respect to the example shown in FIG. 1 will now be described. The surface modification layer 18 is formed over, e.g., directly on, the substrate 12. The first film 20 is applied over, e.g., directly onto, the second surface 16 of the substrate 12. This can be accomplished in any of the conventional methods described above. In a preferred method, the first film 20 is deposited by a wet coating process, such as spin coating or spray coating. The first film 20 is allowed to cure.

The coated substrate (substrate 12 and first film 20) is heated to a temperature (or exposed to an elevated temperature for a selected amount of time) to cause the first film 20 to expand. For example, to cause the surface area of the upper surface 24 of the first film 20 to increase from a first surface area (before heating) to a second surface area (after heating), with the second surface area being greater than the first surface area. The temperature should be sufficient to cause the first film 20 to expand but not so high as to damage, e.g., melt or vitrify, the first film 20.

For example, the coated substrate can be heated to a temperature of at least 100° F. (38° C.), such as at least 200° F. (93° C.), such as at least 300° F. (149° C.), such as at least 500° F. (260° C.), such as at least 750° F. (399° C.), such as at least 1000° F. (538° C.), such as at least 1300° F. (704° C.), such as at least 1500° F. (815° C.), such as at least 1800° F. (982° C.), such as at least 2000° F. (1093° C.). For example, the coated substrate can be heated to a temperature of at least 300° F. (149° C.). For example, the coated substrate can be heated to a temperature of at least 1000° F. (538° C.). For example, the coated substrate can be heated to a temperature of at least 1500° F. (815° C.).

For example, the coated substrate can be heated to a temperature of not more than 2000° F. (1093° C.), such as not more than 1800° F. (982° C.), such as not more than 1500° F. (815° C.), such as not more than 1300° F. (704° C.), such as not more than 1000° F. (538° C.), such as not more than 750° F. (399° C.), such as not more than 500° F. (260° C.), such as not more than 300° F. (149° C.), such as not more than 200° F. (93° C.). For example, the coated substrate can be heated to a temperature of not more than 2000° F. (1093° C.). For example, the coated substrate can be heated to a temperature of not more than 1300° F. (704° C.). For example, the coated substrate can be heated to a temperature of not more than 1000° F. (538° C.).

For example, the coated substrate can be heated to a temperature in the range of 100° F. (38° C.) to 1500° F. (815° C.). For example, in the range of 300° F. (149° C.) to 500° F. (260° C.).

If it is not convenient to measure the actual temperature of the coated substrate, the coated substrate can be exposed to a known temperature for a selected period of time to cause the first film 20 to expand.

For example, the coated substrate can be exposed to a temperature in the range of 100° F. to 2,000° F. (38° C. to 1093° C.), such as 200° F. to 2,000° F. (93° C. to 1093° C.), such as 300° F. to 2,000° F. (149° C. to 1093° C.), such as 500° F. to 2,000° F. (260° C. to 1093° C.), such as 500° F. to 1800° F. (260° C. to 982° C.), such as 500° F. to 1500° F. (260° C. to 815° C.), such as 750° F. to 1500° F. (399° C. to 815° C.), such as 1000° F. to 1300° F. (538° C. to 704° C.).

For example, the coated substrate can be exposed to a temperature (such as in a furnace) in the range of 100° F. to 1500° F. (38° C. to 815° C.). For example, in the range of 300° F. to 500° F. (149° C. to 260° C.).

For example, the coated substrate can be heated for a period of time in the range of 1 minute to 30 minutes, such as 1 minute to 20 minutes, such as 1 minute to 10 minutes, such as 1 minute to 8 minutes, such as 1 minute to 6 minutes, such as 1 minute to 5 minutes, such as 1 minute to 4 minutes, such as 2 minutes to 4 minutes, such as 3 minutes.

For example, the coated substrate can be heated for a period of time in the range of 1 minute to 30 minutes. For example, in the range of 1 minute to 5 minutes.

The second film 26 is formed over the first film 20 while the first film 20 is still in an expanded state, e.g., at an elevated temperature and/or at the second surface area. That is, while the surface area of the first film 20 is greater than the first surface area. The second film 26 can be formed by any conventional method. For example, the second film 26 can be formed by MSVD.

After (or during) deposition of the second film 26, the first film 20 (e.g., coated substrate) is allowed to contract, for example by cooling. By "contract" is meant that the surface area of the first film 20 decreases towards or to the first surface area. The contraction of the first film 20 causes the second film 26 to buckle or ripple. This causes the upper surface 30 of the second film 26 to buckle or ripple also, leading to a non-planar upper surface 30. For example, the upper surface 30 can have crests or ridges separated by troughs, caused by the buckling of the second film 26. These ridges can have a random orientation on the surface 30. The amount of buckling can be impacted by the selection of material(s) of the first film 20 and/or the second film 26. For example, by the relative differences between the coefficients of expansion, the thicknesses of the first and/or second films 20, 26, and/or the temperature to which the coated substrate is heated. Generally, the higher the coefficient of expansion of the first film 20 and/or the higher the temperature to which the coated substrate is heated prior to formation of the second film 26, the more buckling of the second film 26 should occur.

When the coated substrate (substrate 12, first film 20, and second film 26) has cooled, the remaining layers of the OLED 10 can be formed over the surface modification layer 18. Since these additional layers are formed over the non-planar top surface 30 of the second film 26, at least some, if not all, of these layers will also exhibit non-planar surfaces (e.g., non-planar inner surfaces). It is expected that as more layers are formed over the surface modification layer 18, the amount of rippling (i.e., the roughness) of the surfaces of the subsequently applied layers will gradually decrease with the addition of more and more layers. That is, it is expected that the surfaces (e.g., inner surfaces) of the subsequently applied layers will exhibit less and less roughness as more and more layers are formed, due to the smoothing effect these multiple additional layers could have on the roughness of the underlying surface pattern caused by the surface modification layer 18. However, even in the event of this smoothing effect in subsequent layers, the roughened surfaces of the earlier applied layers would still increase the light extraction of the OLED by decreasing the optical waveguide effect in those layers.

Figure 2:
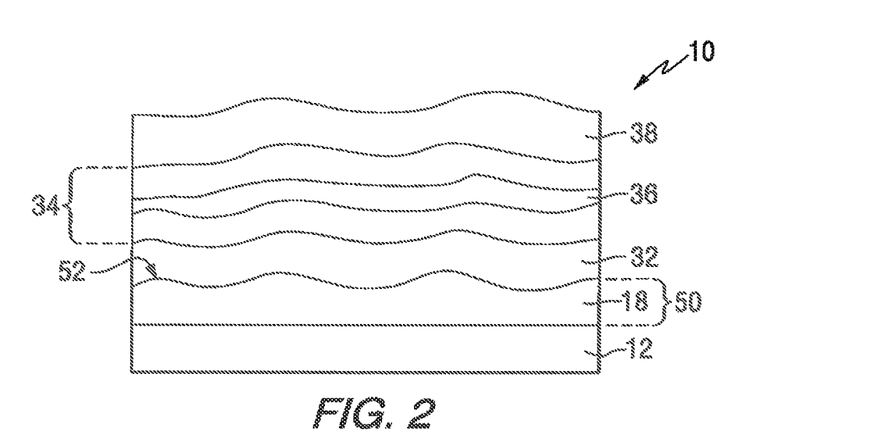
FIG. 2 is a side, sectional view (not to scale) of a variant of the OLED of FIG. 1.

The example OLED shown in FIG. 2 is similar to that in FIG. 1 except that the surface modification layer 18 is illustrated as a single layer 50 having a non-planar inner surface 52. The surface modification layer 18 can be deposited over (e.g., directly onto) the surface 16 of the substrate 12. For example, the surface modification layer 18 can be deposited by MSVD.

The surface modification layer 18 can comprise an oxide, metal oxide, nitride, and/or oxynitride film. For example, the surface modification layer 18 can include an oxide, nitride, and/or oxynitride of one or more of Zn, Fe, Mn, Al, Ce, Sn, Sb, Hf, Zr, Ni, Zn, Bi, Ti, Co, Cr, Si, In, and combinations thereof. For example, the surface modification layer 18 can comprise an inorganic material. For example, alumina, silica, zinc oxide, zirconia, and combinations thereof. For example, the surface modification layer 18 (single layer 50) can comprise alumina and/or silica. For example, a mixture of alumina and silica.

For example, the surface modification layer 18 (single layer 50) can comprise a mixture of alumina and silica having at least 10 wt. % alumina, such as at least 15 wt. % alumina, such as at least 20 wt. % alumina, such as at least 40 wt. % alumina, such as at least 50 wt. % alumina, such as at least 60 wt. % alumina, such as at least 70 wt. % alumina, such as at least 80 wt. % alumina. For example, the surface modification layer 18 can comprise 50 wt. % to 70 wt. % alumina and 50 wt. % to 30 wt. % silica. For example, the surface modification layer 18 can comprise 55 wt. % to 65 wt. % alumina and 45 wt. % to 35 wt. % silica. For example, the surface modification layer 18 can comprise 60 wt. % alumina and 40 wt. % silica.

The surface modification layer 18 can have any desired thickness. For example, the surface modification layer 18 can have a thickness of at least 1 nm, such as at least 5 nm, such as at least 10 nm, such as at least 15 nm, such as at least 20 nm, such as at least 25 nm, such as at least 30 nm, such as at least 40 nm, such as at least 50 nm, such as at least 75 nm, such as at least 100 nm, such as at least 200 nm, such as at least 300 nm, such as at least 400 nm, such as at least 500 nm. For example, the surface modification layer 18 can have a thickness of at least 5 nm. For example, the surface modification layer 18 can have a thickness of at least 10 nm. For example, the surface modification layer 18 can have a thickness of at least 25 nm.

For example, the surface modification layer 18 can have a thickness of not more than 500 nm, such as not more than 400 nm, such as not more than 300 nm, such as not more than 200 nm, such as not more than 100 nm, such as not more than 75 nm, such as not more than 50 nm, such as not more than 40 nm, such as not more than 30 nm, such as not more than 25 nm, such as not more than 20 nm, such as not more than 15 nm, such as not more than 10 nm, such as not more than 5 nm. For example, the surface modification layer 18 can have a thickness of not more than 500 nm. For example, the surface modification layer 18 can have a thickness of not more than 150 nm. For example, the surface modification layer 18 can have a thickness of not more than 50 nm.

For example, the surface modification layer 18 can have a thickness in the range of 1 nm to 500 nm. For example, in the range of 10 nm to 50 nm.

The coated substrate (substrate 12 and surface modification layer 18 can be heated and allowed to cool. It has been discovered that when a single-layer 50 surface modification layer 18 of an oxide film, particularly a metal oxide film, is heated to a temperature as described above and then cooled, the upper surface 52 of the surface modification layer 18 develops buckles or ripples leading to a non-planar surface. The coated substrate can be heated to the temperatures and/or for the time periods as described above with respect to the example of FIG. 1.

Figure 3:
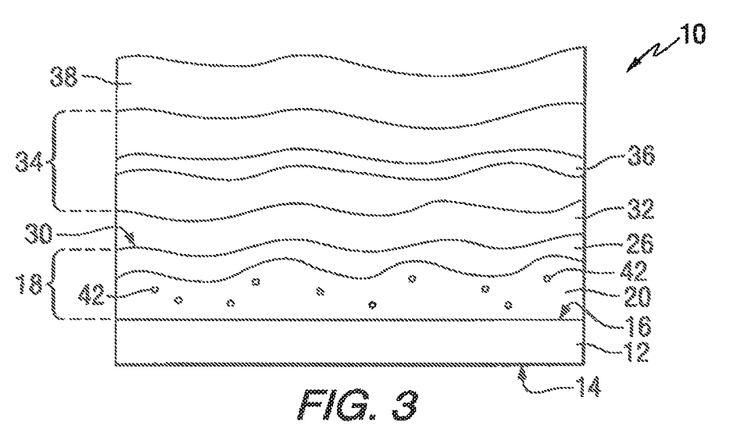
FIG. 3 is a side, sectional view (not to scale) of the OLED of FIG. 1 incorporating optional nanoparticles.

FIG. 3 illustrates an example of the invention in which light scattering materials, such as light scattering particles 42, are incorporated into the surface modification layer 18 (for example, into the first film 20). This can be accomplished by adding the light scattering particles 42 to a coating composition and then applying the coating composition onto the substrate 12 to form a coating layer (e.g., the first film 20) incorporating the light scattering particles 42. The light scattering particles 42 can be randomly distributed throughout the coating layer. Examples of light scattering particles 42 include nanoparticles, such as inorganic nanoparticles, and opaque polymers, such as Celocor® opaque polymer (commercially available from Arkema Coating Resins). Examples of suitable nanoparticles include oxide nanoparticles, such as, but not limited to, alumina, titania, cerium oxide, zinc oxide, tin oxide, silica, fumed silica, and zirconia.

The coating composition can be any material capable of having the light scattering materials, such as nanoparticles, incorporated therein and capable of forming a film. For example, nanoparticles can be dissolved, dispersed, or suspended in the coating material. The first film 20 can be formed by applying the nanoparticle-containing coating material onto the substrate 12. Examples of suitable coating compositions include polymeric materials, polymeric organic materials, and mixtures thereof; thermosetting materials, thermoplastic materials, and mixtures thereof; silicon-containing coating materials, such as organosilicon-containing coating materials; silanes, siloxanes, and/or hydrolysates thereof; organosilanes; silyl substituted materials; and polymers derived from any such preceding such materials. Examples of such polymers include polysilanes, polyorganosilanes, polyorganosiloxanes, polyorganosilazanes, and polyorganosilazoxanes, for example tris[3(trimethoxysilyl)propyl]isocyanate. For example, the coating composition can comprise a polyalkylsiloxane. For example, the coating composition can comprise polydimethylsiloxane. Examples of suitable coating compositions include the Hi-Gard® family of coatings commercially available from PPG Industries, Inc.

The light scattering materials, such as nanoparticles, can be incorporated into the coating composition in any desired amount. For example, the nanoparticles can be at least 0.01 weight percent based on the total weight of the coating composition, such as at least 0.05 weight percent, such as at least 0.1 weight percent, such as at least 0.2 weight percent, such as at least 0.3 weight percent, such as at least 0.4 weight percent, such as at least 0.5 weight percent, such as at least 0.6 weight percent, such as at least 0.8 weight percent, such as at least 1 weight percent, such as at least 2 weight percent, such as at least 3 weight percent, such as at least 5 weight percent, such as at least 10 weight percent, such as at least 20 weight percent, such as at least 25 weight percent, such as at least 30 weight percent, such as at least 50 weight percent.

For example, the light scattering materials can be not more than 50 weight percent based on the total weight of the coating composition, such as not more than 30 weight percent, such as not more than 20 weight percent, such as not more than 10 weight percent, such as not more than 5 weight percent, such as not more than 3 weight percent, such as not more than 2 weight percent, such as not more than 1 weight percent, such as not more than 0.8 weight percent, such as not more than 0.6 weight percent, such as not more than 0.5 weight percent, such as not more than 0.4 weight percent, such as not more than 0.3 weight percent, such as not more than 0.2 weight percent, such as not more than 0.1 weight percent, such as not more than 0.05 weight percent, such as not more than 0.01 weight percent.

For example, the nanoparticles can be present in the range of 0.01 weight percent based on the total weight of the coating composition to 50 weight percent. For example, in the range of 0.01 weight percent to 10 weight percent. For example, in the range of 0.01 weight percent to 5 weight percent.

The coating material(s) of the surface modification layer 18 (e.g., the first film 20 and/or the second film 26) can have a refractive index between the refractive index of the emissive layer 34 and the refractive index of the substrate 12. This can decrease the wave guide effect and/or interference effect caused by the boundaries between the adjacent layers. For example, a glass substrate typically has a refractive index in the range of 1.54 to 1.56. A conventional organic emissive layer typically has a refractive index in the range of 1.55 to 1.8, such as 1.6 to 1.8, such as about 1.7. A surface modification layer 18 (e.g., the first film 20) having a refractive index between 1.5 and 1.7 would be between these two values. Hi-Garde 1600 (commercially available from PPG Industries, Inc.) has a refractive index of about 1.6.

The inner surface 30, 52 of the surface modification layer 18 is a non-planar surface. The inner surface 30, 52 can have an average surface roughness ($R_a$) in the range of 5 nm to 5000 nm. For example, 5 nm to 4000 nm, such as 5 nm to 3000 nm, such as 5 nm to 2000 nm, such as 5 nm to 1000 nm, such as 5 nm to 500 nm, such as 5 nm to 300 nm, such as 5 nm to 200 nm, such as 5 nm to 100 nm, such as 5 nm to 50 nm. For example, 5 nm to 40 nm. For example, 5 nm to 30 nm. For example, 5 nm to 20 nm.

The OLED 10 can include one or more optional underlayers located between the surface modification layer 18 and the substrate 12. The underlayer(s) can be a single layer or a multilayer structure. The underlayer can include one or more metal oxide materials, such as oxides of silicon, titanium, aluminum, zirconium, phosphorus, hafnium, niobium, zinc, bismuth, lead, indium, tin, and alloys and mixtures thereof. The underlayer can be a homogeneous layer, a gradient layer, or can include a plurality of layers or films. By "homogeneous layer" is meant a layer in which the materials are randomly distributed throughout the coating. By "gradient layer" is meant a layer having two or more components, with the concentration of the components continually changing (or stepped) as the distance from the substrate changes. For example, the underlayer can be a mixture of at least silica and titania. For example, a mixture of silica, titania, and phosphorous oxide.

The underlayer can have a thickness in the range of 10 nm to 120 nm. For example, 30 nm to 80 nm. For example, 40 nm to 80 nm. For example, 30 nm to 70 nm.

Operation of the OLED 10 will now be described with particular reference to FIG. 3.

During operation, a voltage is applied across the anode 32 and the cathode 38. A current of electrons flows from the cathode 38 to the anode 32 through the emissive layer 36. This electric current causes the emissive layer 36 to emit light (i.e., electromagnetic radiation of a selected wavelength or range of wavelengths) depending upon the composition of the emissive layer 36. The light waves emitted by the emissive layer 36 travel through the anode 32, through the surface modification layer 18, through the substrate 12, and at least a portion of the light waves exit the outer surface 14 of the substrate 12. Because of the rippled or buckled (non-planar) surfaces of one or more of the OLED layers caused by the surface modification layer 18, less light is trapped within the OLED 10 by the waveguide effect and more light exits the OLED 10. The nanoparticles 42 (if present) in the first film 20 also scatter light and increase the overall light extraction for the OLED 10.

In another aspect of the invention, the surface modification layer 18 could be formed from a composite coating containing a mixture of two or more components that can be selectively removed. For example, the surface modification layer 18 could be formed from a mixture of (i) a first component that is soluble in a first solvent but not soluble or less soluble in a second solvent and (ii) a second component that is soluble in the second solvent but not soluble or less soluble in the first solvent. The first component could be, for example, an oxide, such as a silicon oxide, for example a siloxane. The first solvent can be, for example, an acid, such as hydrofluoric acid (HF) or nitric acid. The second component could be, for example, a polymer, such as polyvinylalcohol (PVA) or polyvinylpyrrolidone (PVP). If a composite surface modification layer 18 comprising a siloxane and PVA is flushed with water, the PVA is removed (at least at or near the surface region) and the siloxane remains. The voids caused by the removal of the PVA leave the resultant surface modification layer 18 with a non-planar surface. Alternatively, the above composite coating could be flushed with HF, removing the siloxane from at least the surface region and leaving the PVA having a non-planar surface.

In another aspect of the invention, the surface of an applied coating could be treated with a surface modification treatment to convert or modify the surface region of the coating with respect to the remainder of the coating. For example, the coating could be polydimetylsiloxane (PDMS). The PDMS coating could be heated and the surface of the PDMS coating subjected to a plasma treatment, which converts the surface of the PDMS coating to a hard silica region. As the coating cools, the hard silica region would buckle, forming a non-planar surface.

The following Example illustrates the invention. However, it is to be understood that the invention is not limited to the specific example.

EXAMPLE

Example 1

This Example illustrates forming a coating with a buckled surface on a glass substrate.

The glass substrate was STARPHIRE® glass (commercially available from PPG Industries Ohio, Inc.) having a thickness of 2 millimeters (mm).

Figure 4:
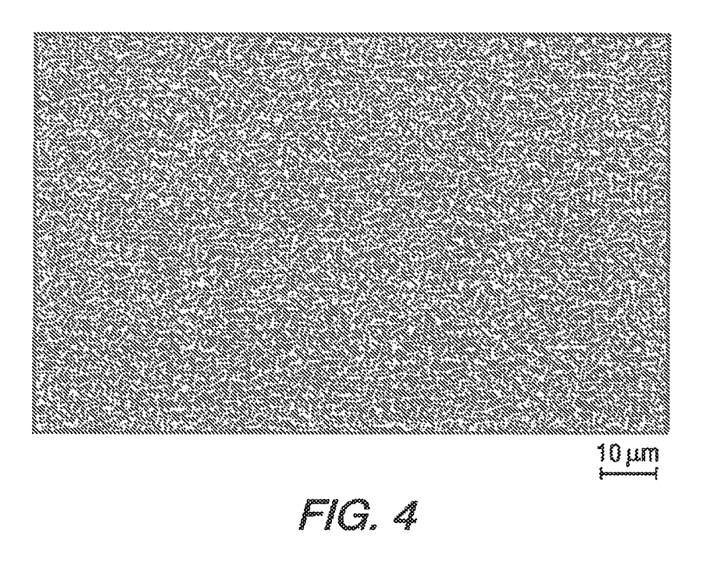
FIG. 4 is a scanning electro-micrograph (SEM) of an OLED substrate described in Example 1.

A cathode having 60 wt. % aluminum and 40 wt. % silicon was sputtered in an oxygen atmosphere to form a surface modification layer of alumina/silica having a thickness of 25 nm on the glass substrate. The coated article (substrate with silica and alumina surface modification layer) was placed in a 1300° F. furnace for three minutes and then removed. When the coated substrate cooled, the surface of the surface modification layer showed a buckled (non-planar) surface (FIG. 4). As seen in the SEM image of FIG. 4, the ridges formed by the heating and cooling of the coated substrate appear to have a random orientation.

It will be readily appreciated by one of ordinary skill in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. An organic light emitting diode, comprising:
    a substrate; and
    a surface modification layer located over the substrate comprising,
    a first film over at least a portion of the substrate having a first coefficient of expansion, wherein the first film comprises a nanoparticles; and a second film over at least a portion of the first film having a second coefficient of expansion and comprising ridges and troughs,
wherein the first coefficient of expansion is greater than the second coefficient of expansion, and wherein the first coefficient of expansion is greater than 100 (at 20° C., $10^{-6}$ m/mK).

2. The organic light emitting diode of claim 1, wherein the second film is in direct contact with the first film.

3. The organic light emitting diode of claim 1, wherein the second film comprises an oxide, a metal oxide, a nitride or an oxynitride film having a metal selected from the group consisting having Zn, Fe, Mn, Al, Ce, Sn, Sb, Gf, Zr, Ni, Zn, Bi, Ti, Co, Cr, Si and In.

4. The organic light emitting diode of claim 1, wherein the second film is thinner than the first film.

5. The organic light emitting diode of claim 1, wherein the second film comprises an oxide selected from the group consisting of alumina, silica, zinc oxide, zirconia and combinations thereof.

6. The organic light emitting diode of claim 1, wherein the second film comprises alumina and silica.

7. The organic light emitting diode of claim 1, wherein the first film comprises polyalkylsiloxane.

8. The organic light emitting diode of claim 1, wherein the second coefficient of expansion is at least 4 (at 20° C., $10^{-6}$ m/mK).

9. The organic light emitting diode of claim 1 further comprising a first electrode over the surface modification layer, an emissive layer over the first electrode and a second electrode over the emissive layer.

10. The organic light emitting diode of claim 1, wherein the nanoparticle comprises a metal oxide.

11. The organic light emitting diode of claim 10, wherein the metal oxide is selected from the group consisting of alumina, titania, cerium oxide, zinc oxide, tin oxide, silica, fumed silica and zirconia.

12. A method of making a surface modification layer comprising the steps of:

forming a first film having a first coefficient of expansion over at least a portion of a substrate, wherein the substrate comprises glass or a transparent polymeric material and wherein the first film comprises a nanoparticle;
heating the substrate coated with the first film to an elevated temperature sufficient to cause the first film to expand to a second surface area;
forming a second film over the first film having a second coefficient of expansion while the first film is expanded to have the second surface area;
cooling the substrate coated with the first film and the second film thereby forming ridges and troughs in the second film,
wherein the first coefficient of expansion is greater than the second coefficient of expansion; and
forming an active stack over the second film.

13. The method of claim 12, wherein the nanoparticle is selected from the group consisting of alumina, titania, cerium oxide, zinc oxide, tin oxide, silica, fumed silica and zirconia.

14. The method of claim 12, wherein the first film comprises 0.01 weight percent to 5 weight percent of the nanoparticle.

15. The method of claim 12, wherein the first film comprises a polyalkylsiloxane.

16. The method of claim 12, wherein the second film comprises a metal oxide.

17. The method of claim 16, wherein the metal oxide is selected from the group consisting of alumina, silica, zinc oxide, zirconia, and combinations thereof.

18. The method of claim 16, wherein the metal oxide is a mixture of alumina and silica.

19. The method of claim 12, wherein the first coefficient of expansion is at least 100 (at 20° C., $10^{-6}$ m/mK).

20. The method of claim 19, wherein the second coefficient of expansion is not more than 100 (at 20° C., $10^{-6}$ m/mK).

* * * * *

UNITED STATES PATENT AND TRADEMARK OFFICE
CERTIFICATE OF CORRECTION

PATENT NO. : 10,096,799 B2  
APPLICATION NO. : 15/453477  
DATED : October 9, 2018  
INVENTOR(S) : John D. Basil et al.

Page 1 of 1

It is certified that error appears in the above-identified patent and that said Letters Patent is hereby corrected as shown below:

On the Title Page

Column 1, Related U.S. Application Data, Line 2, delete "9,791,841." and insert -- 9,761,841. --

In the Claims

Column 20, Line 67, Claim 1, delete "nanoparticles;" and insert -- nanoparticle; --

Column 21, Line 13, Claim 3, delete "Zn" after Ni,

Signed and Sealed this  
Second Day of March, 2021

Drew Hirshfeld  
*Performing the Functions and Duties of the*  
*Under Secretary of Commerce for Intellectual Property and*  
*Director of the United States Patent and Trademark Office*